United States Patent
Li et al.

(10) Patent No.: US 11,849,651 B2
(45) Date of Patent: Dec. 19, 2023

(54) SUPERCONDUCTING DEVICE

(71) Applicant: IQM Finland Oy, Espoo (FI)

(72) Inventors: Tianyi Li, Espoo (FI); Wei Liu, Espoo (FI); Manjunath Ramachandrappa Venkatesh, Espoo (FI); Hasnain Ahmad, Espoo (FI); Kok Wai Chan, Espoo (FI)

(73) Assignee: IQM Finland Oy, Espoo (FI)

( * ) Notice: Subject to any disclaimer, the term of this patent is extended or adjusted under 35 U.S.C. 154(b) by 0 days.

(21) Appl. No.: 17/576,538

(22) Filed: Jan. 14, 2022

(65) Prior Publication Data
US 2022/0238781 A1 Jul. 28, 2022

(30) Foreign Application Priority Data
Jan. 26, 2021 (EP) .................................. 21153383

(51) Int. Cl.
*H10N 60/01* (2023.01)
*H10N 60/10* (2023.01)

(52) U.S. Cl.
CPC ............. *H10N 60/01* (2023.02); *H10N 60/10* (2023.02)

(58) Field of Classification Search
CPC .... H10N 60/01; H10N 60/10; H10N 60/0912; H10N 60/12; H10N 69/00; H01B 12/00
See application file for complete search history.

(56) References Cited

U.S. PATENT DOCUMENTS

| 10,068,184 | B1 | 9/2018 | Hertzberg et al. | |
| 2018/0358538 | A1* | 12/2018 | Brink | H10N 60/805 |
| 2020/0027919 | A1* | 1/2020 | Van Hoogdalem | H01L 29/0669 |
| 2020/0168782 | A1 | 5/2020 | Vivekananda et al. | |
| 2021/0151659 | A1* | 5/2021 | Adiga | H10N 60/12 |
| 2022/0037578 | A1* | 2/2022 | Rodbell | G03F 7/095 |

FOREIGN PATENT DOCUMENTS

| JP | 05243626 | 9/1993 |
| WO | 2017015432 A1 | 1/2017 |

OTHER PUBLICATIONS

European Search Report issued to EP Application No. 21153383 dated Jul. 1, 2021, 2 pages.
Translated Copy of Office Action and Search Report issued by TW Patent Office, dated Sep. 22, 2023.

\* cited by examiner

*Primary Examiner* — Yasser A Abdelaziez
(74) *Attorney, Agent, or Firm* — Meunier Carlin & Curfman LLC

(57) ABSTRACT

This disclosure describes a superconducting device comprising a trench and a cavity that extends through a superconducting base layer. The trench crosses the cavity. The superconducting device further comprises a first junction layer that extends from a first region of the superconducting base layer to the cavity, an insulating layer on the surface of the first junction layer, and a second junction layer that extends from a second region of the superconducting base layer to the cavity. The second junction layer overlaps with the insulating layer on the bottom of the cavity. The disclosure also describes a method for producing this disclosed superconducting device.

15 Claims, 4 Drawing Sheets

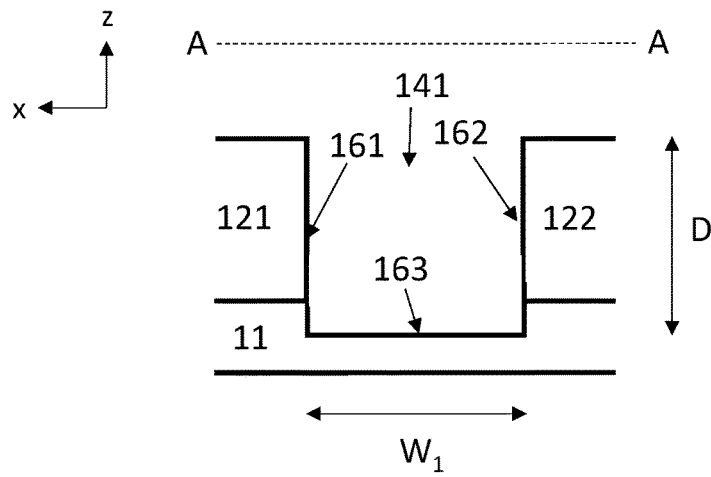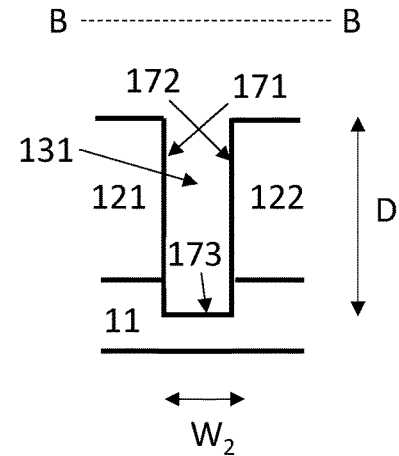
Fig. 1d          Fig. 1e
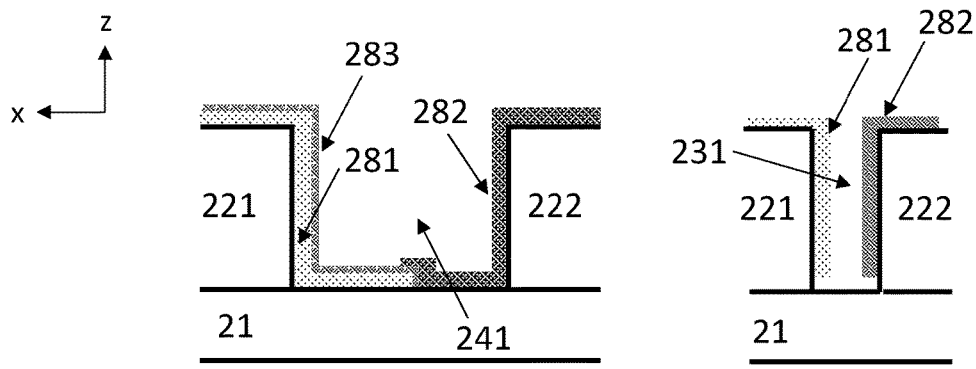
Fig. 2 ents. The pattern includes a# SUPERCONDUCTING DEVICE

PRIORITY CLAIM

This application claims priority to European Patent Application No. 21153383.1, filed on Jan. 26, 2021, the entire disclosure of which is incorporated by reference herein.

FIELD OF THE DISCLOSURE

The present disclosure relates to superconducting devices, and in particular to superconducting devices containing superconductor-insulator-superconductor (SIS) or normal metal-insulator-superconductor (NIS) junctions. The present disclosure further concerns methods for producing such junctions.

BACKGROUND OF THE DISCLOSURE

Superconducting devices can be utilized for many purposes in modern measurement and information systems. The quality and characteristics of the SIS or NIS junctions is often a dominating factor in the performance of the system.

Superconducting junctions can be created on a substrate by angle evaporation, where a hollow structure is created in a resist, and films are deposited on the hollow structure from different angles through a patterned resist so that the films overlap with each other. Additional lithography may be needed for preparing electrical circuitry that is located adjacent to the junction. But the lithography processes needed for patterning resists to create the hollow structure will often leave polymer residues on interfaces and on the substrate. Such residues are a potential source of two-level-systems in the superconducting junction, which can impair their function.

SUMMARY OF THE DISCLOSURE

An object of the present disclosure is to provide an apparatus that improves the performance of superconducting devices.

The object of the disclosure is achieved by a method and an arrangement that are characterized by what is stated in the independent claims. The preferred embodiments of the disclosure are disclosed in the dependent claims.

The disclosure is based on the idea of forming superconducting junctions and capacitive elements within a recessed pattern in a superconducting layer with an angle evaporation method where resists are not needed. The pattern includes a trench that passes through a cavity. The superconducting junction is formed on the bottom of the cavity, and capacitive elements can be formed in the same angle evaporation process between the sidewalls of the trench.

An advantage of the disclosure is that high-quality superconducting junctions can be reliably formed and that the junctions can easily be integrated with adjacent capacitive elements.

BRIEF DESCRIPTION OF THE DRAWINGS

In the following, the disclosure will be described in greater detail by means of preferred embodiments with reference to the accompanying drawings, in which:

FIGS. 1d and 1e illustrate xz-cross sections of the trench and the cavity.

FIG. 2 illustrates junction layers deposited in the trench and the cavity.

DETAILED DESCRIPTION OF THE DISCLOSURE

Figure 1A:
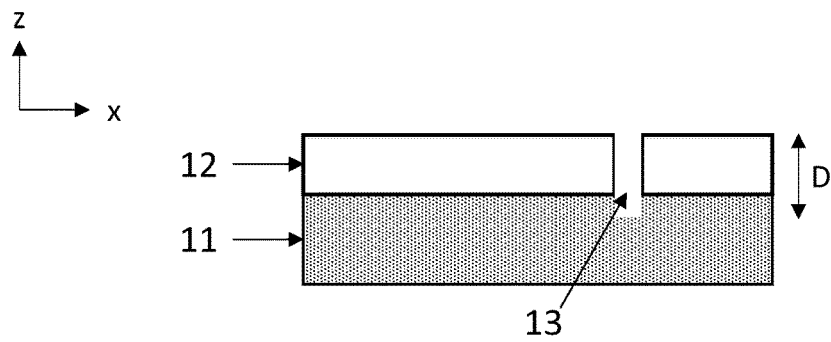
FIGS. 1a and 1b illustrate a trench in a superconducting base layer.

This disclosure describes a method for manufacturing a superconducting device in a superconducting base layer that at least partly covers a substrate. The substrate defines a device plane and the superconducting base layer comprises at least one trench that extends from a first point in the device plane to a second point in the device plane.

The superconducting base layer also comprises a cavity that lies between the first point and the second point, so that the trench crosses the cavity. The method comprises the steps of (1) placing a stencil mask that comprises an opening over the superconducting base layer so that the opening is aligned over the cavity, (2) performing a first angle evaporation through the stencil mask, where a first junction layer is deposited on a first sidewall of the cavity and on the cavity bottom, (3) performing an oxidation step where the first junction layer is oxidized to form a first insulating layer on the surface of the first junction layer, and (4) performing a second angle evaporation through the stencil mask, where a second junction layer is deposited on a second sidewall of the cavity and on the cavity bottom. The second sidewall of the cavity is opposed to the first sidewall of the cavity. The second junction layer overlaps with the first insulating layer on the cavity bottom.

The superconducting device may contain an SIS junction formed by the first and second junction layers. In this case the first junction layer is made of a superconducting material and the second junction layer is also made of a superconducting material.

Alternatively, the superconducting device may contain a NIS junction formed by the first and second junction layers. In this case the first junction layer is made of a superconducting material and the second junction layer is made of a non-superconducting metal.

The opening in the stencil mask may also extend to a part of the trench. The first junction layer may be deposited on a corresponding part of the first sidewall of the trench in the first angle evaporation step. The second junction layer may be deposited on a corresponding part of the second sidewall of the trench in the second angle evaporation step.

This disclosure also describes a superconducting device comprising a substrate that defines a device plane. The superconducting device comprises a superconducting base layer that at least partly covers the substrate. The superconducting base layer comprises a trench that extends from a first point in the device plane to a second point in the device plane. The superconducting base layer also comprises a cavity that lies between the first point and the second point, so that the trench crosses the cavity. The superconducting device further comprises (1) a first junction layer located on a first sidewall of the cavity, on the bottom of the cavity, and on a first sidewall of the trench, (2) a first insulating layer that covers the first junction layer at least on the bottom of the cavity, and (3) a second junction layer located on a second sidewall of the cavity, on the bottom of the cavity, and on a second sidewall of the trench. The second sidewall of the cavity is opposed to the first sidewall of the cavity. The second sidewall of the trench is opposed to the first sidewall of the trench, The second junction layer overlaps with the first insulating layer on the bottom of the cavity.

The superconducting device may contain a SIS junction formed by the first and second junction materials. In this case the first and second junction layers are made of superconducting materials. Alternatively, the superconducting device may contain a NIS junction formed by the first and second junction materials. In this case, the first junction layer is made of a superconducting material and the second junction layer is made of a non-superconducting metal.

The cavity may have a diamond shape in the device plane, where the bases of two isosceles triangles are joined to each other. Alternatively, the cavity may have a rectangular shape in the device plane.

The superconducting base layer may optionally comprise a second cavity that lies between the first point and the second point, so that the trench also crosses the second cavity. The first junction layer then also extends to a first sidewall of the second cavity and to the bottom of the second cavity. A second insulating layer covers the first junction layer on the bottom of the second cavity. The second junction layer also extends to a second sidewall of the second cavity and to the bottom of the second cavity. The second sidewall of the second cavity is opposed to the first sidewall of the second cavity. The second junction layer overlaps with the second insulating layer on the bottom of the second cavity.

The second cavity may have a diamond shape in the device plane, where the bases of two isosceles triangles are joined to each other. The second cavity may alternatively have a rectangular shape in the device plane.

The superconducting device may be any device where superconductor-insulator-superconductor junctions (SIS) can be used, for example a qubit or a superconducting quantum interference device (SQUID). Alternatively, the superconducting device may be any device where normal metal-insulator-superconductor (NIS) junctions can be used, for example a quantum circuit refrigerator or a low-temperature thermometer.

In this disclosure, the device plane is illustrated and referred to as the xy-plane. The device plane may also be called the horizontal plane. The z-axis is perpendicular to the xy-plane, and the z-direction is referred to as the vertical direction. Expressions such as "top" and "bottom" refer to a corresponding vertical order. In this disclosure, the words "horizontal" and "vertical" only refer to the device plane and a direction perpendicular to the device plane, respectively. The words "horizontal" and "vertical" do not imply anything about how the device should be oriented during manufacture or usage.

Figure 1B:
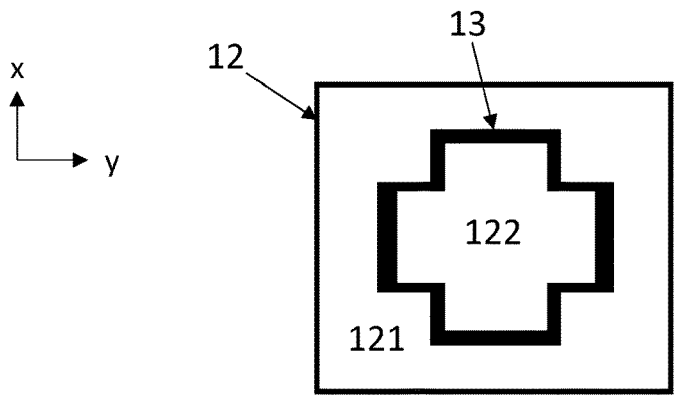

FIG. 1a illustrates in the xz-plane a substrate 11, a superconducting base layer 12, and a trench 13 in the superconducting base layer 12. FIG. 1b illustrates the same device in the xy-plane, where the trench 13 surrounds a cross-shaped inner area of the superconducting base layer 12. The trench 13 thereby divides the superconducting base layer 12 into a first region 121 and a second region 122. In the example of FIG. 1b, the trench 13 forms a cross-shaped closed pattern in the superconducting base layer 13. This pattern could, for example, be employed in a qubit. However, the trench 13 could alternatively define any other closed pattern that divides the base layer into two regions, or it could simply extend from one edge of the base layer 12 to another edge.

All trenches and cavities described in this disclosure may, for example, be formed in the superconducting base layer by reactive ion etching (RIE) or any other suitable method. It can be seen in FIG. 1a that the trench extends through the superconducting base layer in the vertical direction that is perpendicular to the device plane. The bottom of the trenches and cavities discussed in this disclosure is thereby recessed from the top of the superconducting base layer by a distance that corresponds to the depth D of the trench.

The trench 13 is typically etched some distance into the substrate 11, as FIG. 1a illustrates. This can enable the desired aspect ratios to be obtained in the trench 13 even with a thinner base layer 12, and it also removes the risk that remnants of the base layer 12 will cause short-circuits on the bottom of the trench 13.

Figure 1C:
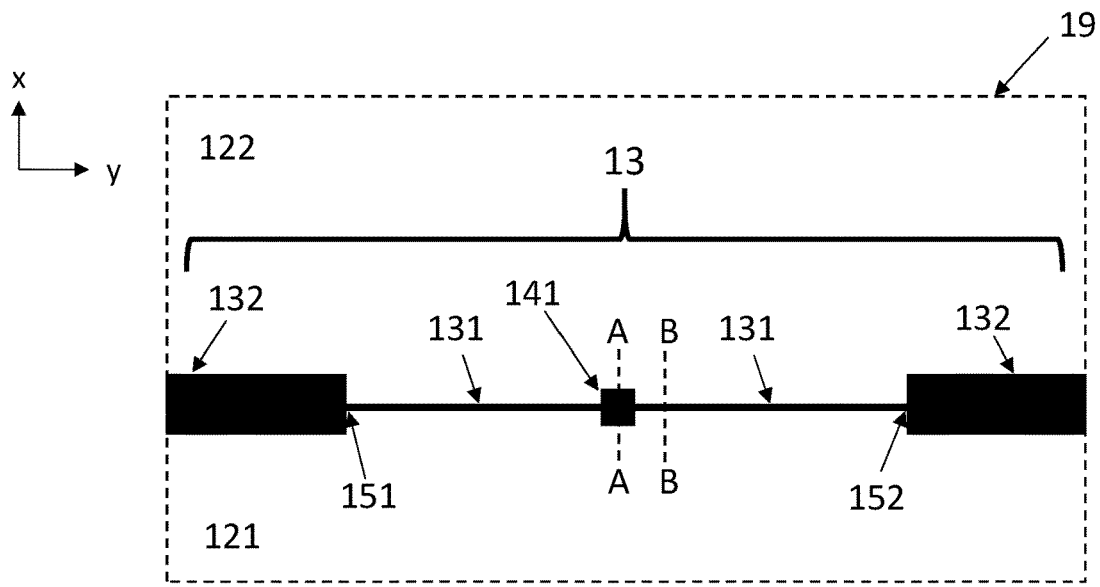
FIG. 1c illustrates a superconducting device with a trench and a cavity in the xy-plane.

FIG. 1c illustrates a smaller region 19 of the device illustrated in FIG. 1b, where the trench 13 separates the superconducting base layer 12 into first and second regions 121 and 122. The trench 13 continues beyond the region 19. The trench 13 comprises a narrow section 131, which extends from a first point 151 to a second point 152. It also comprises wide sections 132. The capacitance between the first and second sections 121 and 122 of the superconducting base layer may in this case be primarily determined by the dimensions and the electric properties of the narrow section 131. The region 19 could be located in any part of a trench 13 that separates the base layer into the first and second regions shown in FIG. 1b.

The narrow section 131 of the trench 13 may for simplicity be referred to simply as the trench 13 when the formation of the SIS or NIS junction is discussed. The wide sections 132 of the trench are covered by the stencil mask when the first and second junction layers are deposited, so no junctions are formed in the wide sections 132. The primary purpose of the wide sections 132 in the superconducting device is merely to separate the superconducting base layer 12 into two separate regions 121 and 122.

The superconducting base layer in FIG. 1c also comprises a first cavity 141. In this disclosure, the term "cavity" refers to a hollow opening that may, for example, have a rectangular shape, as FIG. 1c illustrates, a diamond shape or any other suitable shape in the xy-plane. Cavities can be etched in the superconducting base layer 12 in the same etching process for etching the trench. The trench 13 crosses the cavity 141 in a first direction, which in FIG. 1c corresponds to the y-direction. The trench 13 does not necessarily have to extend in a straight line from the first point 151 to the second point 152.

FIG. 1d illustrates an xz-cross section of the cavity 141 along the line A-A in FIG. 1c. The cavity 141 has a first cavity sidewall 161, a second cavity sidewall 162, and a cavity bottom 163. In the case illustrated in FIG. 1c, the first and second cavity sidewalls 161 and 162 are directly opposed to each other.

In this disclosure, the expression "opposed sidewalls" has the following meaning. Two sidewalls are opposed to each other if the first angle evaporation step can be carried out only on the first sidewall, while keeping the second sidewall in the "shadow" of the superconducting base layer, and if the second angle evaporation step can be carried out only on the second sidewall, while keeping the first sidewall in the "shadow" of the superconducting base layer. In the illustrations of this disclosure, this means that the sidewalls are separated from each other in the x-direction, as FIGS. 1d and 1e illustrate. However, the two sidewalls do not necessarily have to be fully parallel with each other in the y-direction. The sidewalls may have any shape in the xy-plane that extends substantially in the y-direction. For example, the sidewalls may form an angled shape, which produces the diamond-shaped cavity discussed below.

Furthermore, the sidewalls of the cavity 141 may be displaced from the narrow section 131 of the trench by the same distance in opposite x-directions. However, the cavity 141 does not necessarily have to be symmetric with respect to the y-axis defined by the narrow section 131, and the sidewalls do not necessarily have to be parallel to that axis as they are shown in FIG. 1c.

FIG. 1e illustrates an xz-cross section of the narrow section 131 along the line B-B in FIG. 1c. The narrow section 131 has a first trench sidewall 171, a second trench sidewall 172, and a trench bottom 173.

It was mentioned above that the trench 13 crosses the cavity 141 in the first direction, which in FIGS. 1d and 1e is the direction that is perpendicular to the illustrated xz-plane. The width $W_1$ of the cavity 141 in a second direction, perpendicular to the first direction, is greater than the width $W_2$ of the narrow section 131 of the trench in the second direction. The second direction is the x-direction in FIGS. 1d and 1e. If the sidewalls of the cavity 141 are not both parallel to the first direction, the width $W_1$ of the cavity 141 may be defined as the maximum distance between the first and second cavity sidewalls 171 and 172 in the second direction.

Assuming that the first cavity 141 and the trench 13 are formed in the same etching process, their depths D will be equal. The depth D may, for example, range from a few hundred nanometers up to 10 μm, or it may be in the range 1-5 μm. The aspect ratio $D/W_1$ of any first or second cavity presented in this disclosure may, for example, be in the range 0.1-10 or 0.2-5. The aspect ratio $D/W_2$ of the narrow section of the trench may, for example, be in the range 0.1-20 or 0.2-5. The aspect ratio $D/W_1$ nevertheless sets a lower limit for the aspect ratio $D/W_2$, so the aspect ratio $D/W_2$ may be in the range $D/W_1$-20 or in the range $D/W_1$-5.

The superconducting base layer is made of a first superconducting material. As mentioned before, the trench 13 separates the superconducting base layer into a first region 121 and a second region 122 in the device plane, so that the first region of the superconducting base layer is electrically separated from the second region of the superconducting base layer.

The cavity 141, which may be called a first cavity, lies between the first point 151 and the second point 152, so that the trench 13 crosses the first cavity 141 in a first direction. The first cavity 141 extends through the superconducting base layer 12 in the direction that is perpendicular to the device plane. The first cavity 141 has a first cavity sidewall on the side of the first region 121 of the superconducting base layer and a second cavity sidewall on the side of the second region 122 of the superconducting base layer. The first cavity 141 has a first cavity bottom.

The narrow section 131 of the trench 13 comprises a trench bottom, a first trench sidewall on the side of the first region 121 of the superconducting base layer, and a second trench sidewall on the side of the second region 122 of the superconducting base layer 12. The width of the first cavity 141 in a second direction is greater than the width of the narrow section 131 of the trench 13 in the second direction. The second direction is substantially perpendicular to the first direction.

FIG. 2 illustrates xz-cross sections that correspond to the cross-sections of FIGS. 1d and 1e, respectively. Reference numbers 21, 221, 222, 231 and 241 correspond to reference numbers 11, 121, 122, 131 and 141, respectively, in FIGS. 1a-1e. FIG. 2 illustrates a first junction layer 281 that extends from the first region 221 of the superconducting base layer to the first cavity sidewall, to the cavity bottom, and to the first trench sidewall.

The superconducting device also comprises a first insulating layer 283 that covers the first junction layer 281 at least on the bottom of the cavity. The superconducting device also comprises a second junction layer 282 that extends from the second region 222 of the superconducting base layer to the second cavity sidewall, to the cavity bottom, and to the second trench sidewall. The second junction layer 282 overlaps the first insulating layer 283 on the bottom of the cavity.

The substrate may be a silicon substrate, or any other suitable substrate. The superconducting base layer covers at least a part of the substrate. The first superconducting material may, for example, include Nb, Al, TiN, NbN, or NbTiN. In this disclosure, the term "junction layer" refers to a layer which forms the first side of either an SIS junction or an NIS junction. In the case of SIS junctions, the first junction layer is made of a second superconducting material. The second superconducting material may, for example, include Nb, Al, TiN, NbN, or NbTiN. In all embodiments of this disclosure, the second superconducting material may be the same material as the first superconducting material mentioned above. Alternatively, the second superconducting material may be different from the first.

The first insulating layer 283 is typically an oxide layer that is formed spontaneously on the surface of the first superconducting layer 281 when it is exposed to oxygen.

In SIS junctions, the second junction layer is made of a third superconducting material, which may, for example, include Nb, Al, TiN, NbN, or NbTiN. In NIS junctions, the second junction layer is made of a non-superconducting metal (which may also be called a normal metal) that is suitable for NIS junctions, for example, copper or silver.

In all embodiments presented in this disclosure, the third superconducting material may be the same material as the first superconducting material mentioned above. Alternatively, the third superconducting material may be different from the first superconducting material.

In the case of SIS junctions, the third superconducting material may be the same material as the second superconducting material mentioned above. Alternatively, the third superconducting material may be different from the second.

In other words, in an SIS junction, the first junction layer can be made of a second superconducting material and the second junction layer can also be made of the second superconducting material. These junctions may, for example, be used in qubits.

In a NIS junction, the first junction layer can be made of a second superconducting material and the second junction layer can be made of a non-superconducting metal. These junctions may, for example, be used in quantum circuit refrigerators or low-temperature thermometers.

An oxide layer may be formed on the surface of first junction layer 281, on the top surface, and on the trench sidewall. The second junction layer 282 may also be oxidized on the top surface, in the cavity, and in the trench. However, these additional oxide layers will not serve any particular technical purpose in the superconducting device. The additional oxide layers may be removed in some areas, for example, by ion milling. The first insulating layer 283, on the other hand, is an essential component of the SIS and NIS junctions, which are created on the bottom of the cavity 241.

In the narrow section 231 of the trench, the first and the second junction layers 281 and 282 will typically extend only along a portion of the sidewall without reaching the bottom of the trench. However, it is possible that the first and/or the second junction layer 281/282 extend to the trench bottom as long as they do not come into electrical contact with each other.

Figure 3A:
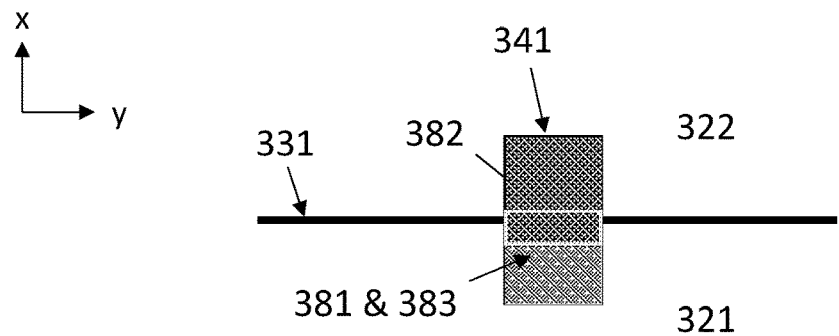
FIGS. 3a and 3b illustrate two alternative shapes for a cavity in the xy-plane.

The cavity may have a rectangular shape in the device plane. FIG. 3a illustrates a top view of the cavity 341 and the first and second junction layers 381 and 382 (with insulating layer 383), which overlap on the bottom of the cavity 341. When the manufacturing method described below is used to prepare the superconducting device, the overlap area where the second junction layer 382 overlaps with the insulating layer 383 and the first junction layer 381 will then also have a rectangular shape. A light rectangle has been drawn in FIG. 3a to illustrate the overlap area. The dimension of the rectangle in the x-direction depends on the angles that are used in the angle evaporation process, and on the depth and width of the cavity 341.

Figure 3B:
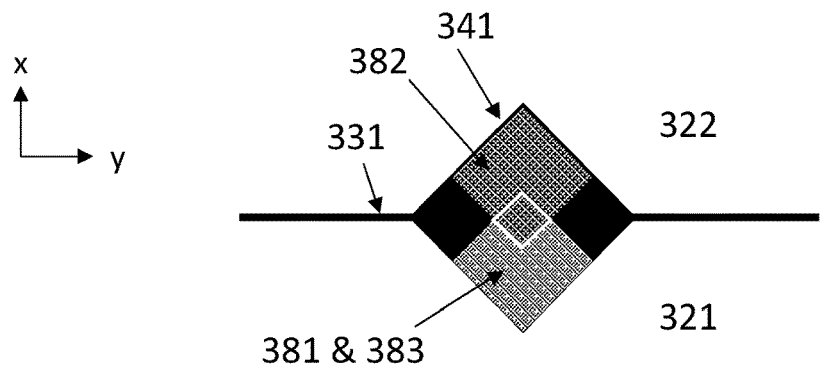

In both FIGS. 3a and 3b, reference numbers 321-322, 331, 341 and 381-383 correspond to reference numbers 221-222, 231, 241 and 281-283, respectively, in FIG. 2.

The cavity may alternatively have a diamond shape in the device plane, where bases of two isosceles triangles are joined to each other. This is illustrated in FIG. 3b. When the manufacturing method described below is used to prepare the superconducting device, the diamond shape leads to a diamond-shaped overlap area, illustrated with a light diamond shape in FIG. 3b. The size of the diamond-shaped overlap area depends on the angles that are used in the angle evaporation process. It can be seen in FIG. 3b that the diamond shape enables the dimensions of the junction to be made significantly smaller than those of the cavity 341.

Figure 4:
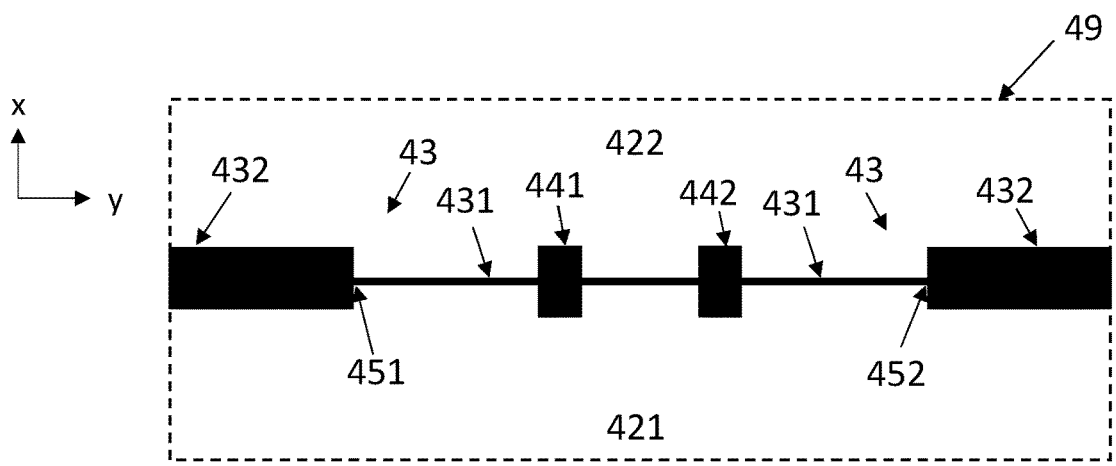
FIG. 4 illustrates a superconducting device with a trench and two cavities in the xy-plane.

All principles discussed above with reference to FIGS. 1a-3b can also be applied to superconducting devices that contain more than one cavity formed in the narrow section of the trench. FIG. 4 illustrates an example device where a first SIS junction is formed on the bottom of the first cavity and a second SIS junction is formed on the bottom of a second cavity where reference numbers 421-422, 43, 431-432, 441, 451-452 and 49 correspond to reference numbers 121-122, 13, 131-132, 141, 151-152 and 19, respectively, in FIG. 1c.

In FIG. 4, the superconducting base layer also comprises a second cavity 442 that lies between the first point 451 and the second point 452. The narrow section 431 of the trench 43 extends between the first cavity 441 and the second cavity 442 and crosses the second cavity 442 in the first direction. The second cavity 442 extends through the superconducting base layer in the direction that is perpendicular to the device plane. In direct analogy to the presentation that was given with reference to FIG. 1d, the second cavity 442 has a first second cavity sidewall on the side of the first region of the superconducting base layer and a second second cavity sidewall on the side of the second region of the superconducting base layer. The second cavity 442 also has a second cavity bottom. The width of the second cavity 442 in the second direction is greater than the width of the narrow section 431 in the second direction.

When the angle evaporation is carried out, the first and second junction layers are also deposited in the second cavity. In direct analogy to FIG. 2, the first junction layer 281 will then also extend from the first region 221 of the superconducting base layer to the first second cavity sidewall and the second cavity bottom, and a second insulating layer will cover the first junction layer 281 at least on the second cavity bottom. The second junction layer 282 will extend from the second region 222 of the superconducting base layer to the second second cavity sidewall and to the second cavity bottom so that the second junction layer 282 overlaps with the second insulating layer on the bottom of the second cavity.

The first and second cavities may both have a diamond shape in the device plane, where bases of two isosceles triangles are joined to each other. Alternatively, they may have a rectangular shape.

The superconducting device with a double SIS junction may, for example, be a superconducting quantum interference device where the parts of the superconducting base layer that are adjacent to the two junctions form the SQUID loop. The device may also be used as a qubit.

The method will now be described in more detail. As mentioned before, the method comprises the step of etching a pattern in a superconducting base layer, which at least partly covers a substrate that defines a device plane. The superconducting base layer is made of a first superconducting material.

The pattern comprises at least one trench that extends through the superconducting base layer in a direction that is perpendicular to the device plane. The trench separates the superconducting base layer into a first region and a second region in the device plane, so that the first region of the superconducting base layer is electrically separated from the second region of the superconducting base layer. The trench may comprise a narrow section that extends from a first point in the device plane to a second point in the device plane, and a wider section that extends to other parts of the device plane to complete the separation of the two regions. The trench could alternatively have a uniform width.

The pattern further comprises a cavity that lies between the first point and the second point, so that the trench crosses the cavity. The cavity extends through the superconducting base layer in the direction that is perpendicular to the device plane. The cavity has a first sidewall on the side of the first region of the superconducting base layer and a second sidewall on the side of the second region of the superconducting base layer. The cavity has a cavity bottom.

The narrow section of the trench comprises a trench bottom, a first trench sidewall on the side of the first region of the superconducting base layer, and a second trench sidewall on the side of the second region of the superconducting base layer. The width of the cavity in a second direction is greater than the width of the narrow section of the trench in the second direction. The second direction is substantially perpendicular to the first direction.

An opening in a stencil mask is aligned with the narrow section of the trench so that the first and second junction layers are deposited at least in the cavity. In practice, the opening in the stencil mask should be sufficiently small to be placed between the first and second points 151 and 152 in FIG. 1c, so that the first and second junction layers are not deposited in the wider regions 132 of the trench. The opening in the stencil mask may be large enough to allow the deposition of the first and second junction layers into a part of the narrow section 131 of the trench. The dimensions of the narrow section 131 and the angles through which the angle evaporation is carried out should be selected so that the first and second junction layers do not overlap on the bottom of the narrow section 131 of the trench 13. The first and second junction layers may nevertheless be deposited on the sidewalls of the narrow section, as FIG. 2 illustrates.

The method further comprises a first angle evaporation step where a first junction layer is deposited at least on the first sidewall of the cavity and on the cavity bottom. In practice, the first junction layer will also be deposited on some parts of the trench sidewall. In the oxidation step, the first junction layer is oxidized to form a first insulating layer on the surface of the first junction layer at least on the bottom of the cavity. The method also comprises a second angle evaporation step where a second junction layer is deposited on the second sidewall of the cavity and on the bottom of the cavity. As before, this also involves deposition of the second junction layer on the second trench sidewall. The second junction layer then overlaps with the first insulating layer on the bottom of the cavity, but not on the bottom of the trench.

The stencil mask is aligned over the substrate during the first and second angle evaporation steps, and an opening in the stencil mask may be aligned with the narrow section of the trench and the cavity (and the second cavity, if it is present). The opening should not extend beyond the first and second points 151-152 and 451-452 in FIGS. 1c and 4, respectively, since the junction layers should not be deposited in the regular sections 132/432 of the trench 13/43.

Figure 5A:
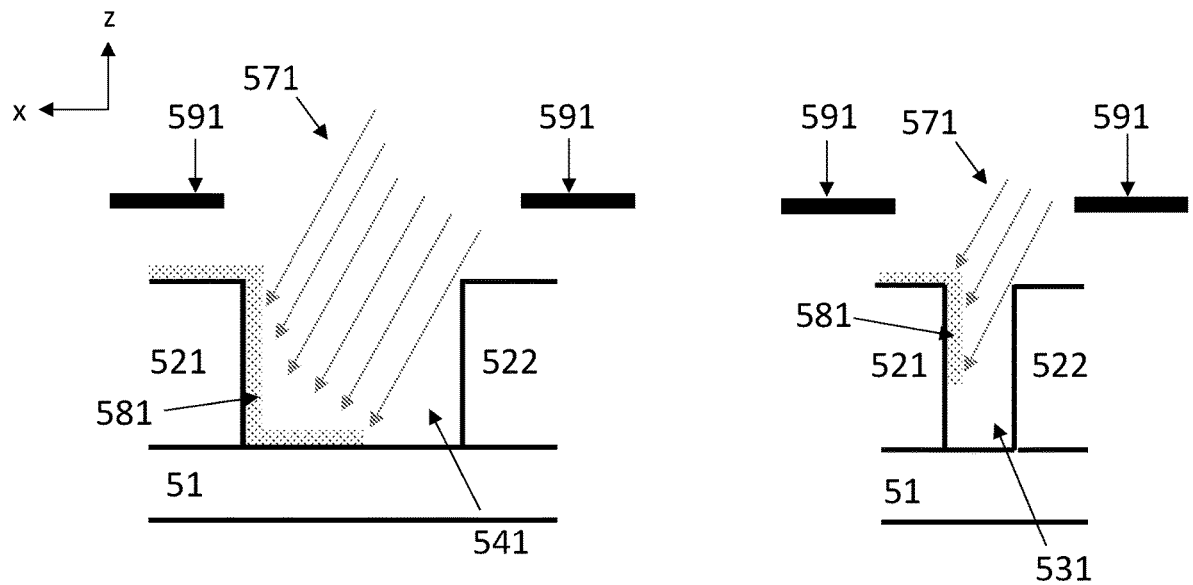
FIGS. 5a and 5b illustrate a manufacturing method.
Figure 5B:
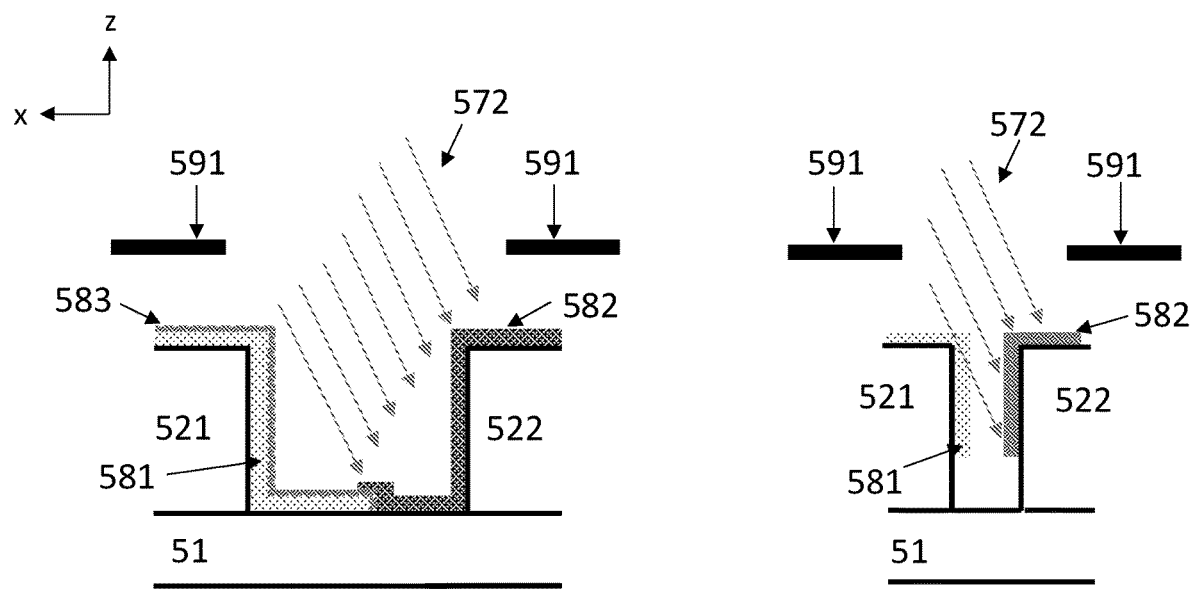

FIG. 5a illustrates the first angle evaporation step and FIG. 5b illustrates the second angle evaporation step. Reference numbers 51, 521-522, 531, 541 and 581-583 correspond to reference numbers 21, 221-222, 231, 241 and 281-283, respectively, in FIG. 2. The material that will form the first junction layer 581 is deposited onto the pattern in the superconducting base layer from a first deposition direction indicated by the arrows 571. The substrate where the device is formed may, for example, be tilted by an angle Θ about the y-axis. The angle between the first deposition direction 571 and the vertical z-axis (which is defined in relation to the substrate) will then also be Θ. FIG. 5a also illustrates a stencil mask 591, which has an opening above the cavity 541 and the narrow section 531 of the trench.

When the opening in the stencil mask is aligned in a suitable manner, and when the angle Θ and the width of the narrow section 531 of the trench are given suitable values, the first junction layer 581 is deposited on the first sidewall of the cavity, the bottom of the cavity, and on at least part of the first trench sidewall between the first and second points. The first junction layer 581 can, but does not have to, extend all the way to the bottom of the trench, as long as it does not come into direct contact with the second junction layer at the bottom of the trench.

In the oxidation step (not separately illustrated) the first junction layer is oxidized with high purity oxygen gas in a controlled environment to form a first insulating layer 583 on its surface. The in-situ oxidation process is done without breaking vacuum in between the first and second junction layer deposition. FIG. 5b illustrates the second angle evaporation step where the second junction layer is deposited. The substrate where the device is formed may in this evaporation step be tilted by an angle φ about the y-axis in the opposite direction (compared to FIG. 5a). The angle between the second deposition direction 572 and the vertical axis (which is defined in relation to the substrate) will then be φ. The absolute value of φ may, but does not necessarily have to be, equal to the absolute value of Θ.

Again, when the opening in the stencil mask is dimensioned in a suitable manner, and when the angle φ is given a suitable value, the second junction layer 582 is deposited on the second sidewall of the cavity, the bottom of the cavity, and on at least part of the second trench sidewall, and the second junction layer overlaps with the first insulating layer on the bottom of the cavity to complete the junction.

The same method may be used to prepare a superconducting device with multiple junctions. In this case the pattern also comprises a second cavity that also lies between the first point and the second point. The narrow section of the trench extends between the first cavity and the second cavity and crosses the second cavity. The second cavity extends through the superconducting base layer in the direction that is perpendicular to the device plane. The second cavity has a first second cavity sidewall on the side of the first region of the superconducting base layer and a second second cavity sidewall on the side of the second region of the superconducting base layer. The second cavity has a second cavity bottom, and the width of the second cavity in the second direction is greater than the width of the narrow section in the second direction.

In the first angle evaporation step, the first junction layer is then also deposited on the first second cavity sidewall and the second cavity bottom. In the oxidation step, the first junction layer is also oxidized to form a second insulating layer, which is formed on the surface of the first junction layer and at least on the second cavity bottom. In the second angle evaporation step, the second junction layer is also deposited on the second second cavity sidewall and the second cavity bottom, so that the second junction layer overlaps with the first insulating layer on the second cavity bottom.

The method described above can be used to increase the capacitance between the first and second regions of the superconducting base layer 121 and 122 in FIG. 1 and 421 and 422 in FIG. 4. This facilitates greater design freedom in the superconducting base layer in devices where a superconductor junction is connected in parallel with a capacitor. For example, cross-shaped patterns such as the one illustrated in FIG. 1b may in some cases be replaced with smaller patterns, which allows the superconducting device to be miniaturized.

The invention claimed is:

1. A method for manufacturing a superconducting device in a superconducting base layer that at least partly covers a substrate, wherein the substrate defines a device plane and the superconducting base layer comprises at least one trench that extends from a first point in the device plane to a second point in the device plane,
   wherein the superconducting base layer also comprises a cavity that lies between the first point and the second point, so that the at least one trench crosses the cavity, the method comprises the steps of:
     placing a stencil mask that comprises an opening over the superconducting base layer so that the opening is aligned over the cavity;
     performing a first angle evaporation through the stencil mask, where a first junction layer is deposited on a first sidewall of the cavity and on a cavity bottom;
     performing an oxidation step where the first junction layer is oxidized to form a first insulating layer on the surface of the first junction layer; and
     performing a second angle evaporation through the stencil mask, where a second junction layer is deposited on a second sidewall of the cavity and on the cavity bottom, wherein the second sidewall of the cavity is opposed to the first sidewall of the cavity, so that the second junction layer overlaps with the first insulating layer on the cavity bottom.

2. The method according to claim 1, wherein the first junction layer is made of a superconducting material and the second junction layer is also made of a superconducting material.

3. The method according to claim 1, wherein the first junction layer is made of a superconducting material and the second junction layer is made of a non-superconducting metal.

4. The method according to claim 1, wherein the cavity has a diamond shape in the device plane, where bases of two isosceles triangles are joined to each other.

5. The method according to claim 1, wherein the cavity has a rectangular shape in the device plane.

6. A superconducting device comprising:
a substrate that defines a device plane;
a superconducting base layer that at least partly covers the substrate, the superconducting base layer including:
a trench that extends from a first point in the device plane to a second point in the device plane, and
a cavity that lies between the first point and the second point, so that the trench crosses the cavity;
a first junction layer located on a first sidewall of the cavity, on the bottom of the cavity, and on a first sidewall of the trench;
a first insulating layer that covers the first junction layer at least on the bottom of the cavity; and
a second junction layer located on a second sidewall of the cavity, on the bottom of the cavity, and on a second sidewall of the trench,
wherein the second sidewall of the cavity is opposed to the first sidewall of the cavity,
wherein the second sidewall of the trench is opposed to the first sidewall of the trench, and
wherein the second junction layer overlaps with the first insulating layer on the first cavity bottom.

7. The superconducting device according to claim 6, wherein the first and second junction layers are made of superconducting materials.

8. The superconducting device according to claim 7, wherein the cavity has:
a diamond shape in the device plane, where bases of two isosceles triangles are joined to each other; or
a rectangular shape in the device plane.

9. The superconducting device according to claim 6, wherein the first junction layer is made of a superconducting material and the second junction layer is made of a non-superconducting metal.

10. The superconducting device according to claim 9, wherein the cavity has:
a diamond shape in the device plane, where bases of two isosceles triangles are joined to each other; or
a rectangular shape in the device plane.

11. The superconducting device according to claim 6, wherein the superconducting base layer further comprises a second cavity that lies between the first point and the second point, so that the trench also crosses the second cavity.

12. The superconducting device according to claim 11, wherein the first junction layer also extends to a first sidewall of the second cavity and to the bottom of the second cavity, and
wherein a second insulating layer covers the first junction layer on the bottom of the second cavity.

13. The superconducting device according to claim 12, wherein the second junction layer also extends to a second sidewall of the second cavity and to the bottom of the second cavity,
wherein the second sidewall of the second cavity is opposed to the first sidewall of the second cavity, and
wherein the second junction layer overlaps with the second insulating layer on the bottom of the second cavity.

14. The superconducting device according to claim 11, wherein the second cavity has a diamond shape in the device plane, where bases of two isosceles triangles are joined to each other.

15. The superconducting device according to claim 11, wherein the second cavity has a rectangular shape in the device plane.

* * * * *